United States Patent
Das et al.

(10) Patent No.: US 7,530,008 B2
(45) Date of Patent: May 5, 2009

(54) SCALABLE-CHIP-CORRECT ECC SCHEME

(75) Inventors: Debaleena Das, Waltham, MA (US); Alan H. Mandel, Framingham, MA (US)

(73) Assignee: Sun Microsystems, Inc., Santa Clara, CA (US)

( * ) Notice: Subject to any disclaimer, the term of this patent is extended or adjusted under 35 U.S.C. 154(b) by 1068 days.

(21) Appl. No.: 10/637,469

(22) Filed: Aug. 8, 2003

(65) Prior Publication Data

US 2005/0034050 A1 Feb. 10, 2005

(51) Int. Cl.
*H03M 13/00* (2006.01)
(52) U.S. Cl. ........................ 714/784; 714/769
(58) Field of Classification Search .............. 714/784
See application file for complete search history.

(56) References Cited

U.S. PATENT DOCUMENTS

| | | | |
|---|---|---|---|
| 3,868,632 A * | 2/1975 | Hong et al. ............... 714/755 |
| 4,376,300 A | 3/1983 | Tsang |
| 4,434,459 A | 2/1984 | Holland et al. |
| 4,584,681 A | 4/1986 | Singh et al. |
| 4,604,751 A | 8/1986 | Aichelmann, Jr. et al. |
| 4,617,664 A | 10/1986 | Aichelmann, Jr. et al. |
| 4,646,312 A * | 2/1987 | Goldsbury et al. ......... 714/763 |
| 5,058,115 A | 10/1991 | Blake et al. |
| 5,077,737 A | 12/1991 | Leger et al. |
| 5,081,626 A * | 1/1992 | Scott ..................... 714/732 |
| 5,164,944 A | 11/1992 | Benton et al. |
| 5,228,046 A | 7/1993 | Blake et al. |
| 5,233,614 A | 8/1993 | Singh |
| 5,251,219 A | 10/1993 | Babb |
| 5,255,226 A | 10/1993 | Ohno et al. |
| 5,276,834 A | 1/1994 | Mauritz et al. |
| 5,291,496 A | 3/1994 | Andaleon et al. |
| 5,425,038 A * | 6/1995 | Chen ..................... 714/755 |
| 5,463,644 A | 10/1995 | Rodi et al. |

(Continued)

OTHER PUBLICATIONS

Polianskikh, B. et al., "design and Implementation of Error Detection and Correction Circuitry for Multilevel Memory Protection," Multiple-Valued Logic 2000. ISMVL 2002. Proceedings 32nd IEEE International Symposium on May 5-18, 2002, pp. 89-95.

(Continued)

*Primary Examiner*—Esaw T Abraham
*Assistant Examiner*—Enam Ahmed
(74) *Attorney, Agent, or Firm*—Lawrence J. Merkel; Meyertons, Hood, Kivlin, Kowert & Goetzel, P.C.

(57) ABSTRACT

An apparatus comprises an encode circuit coupled to receive input data and configured to generate corresponding codewords and a decode circuit coupled to receive codewords and detect an error in the codewords (and may, in some cases, correct the error). Each codeword comprises a plurality of b-bit portions (b is an integer greater than one). Additionally, each codeword comprises a first set of b check bits used to detect a magnitude of an error in a b-bit portion of the plurality of b-bit portions. Each codeword further comprises a second set of w check bits used to locate which one of the plurality of b-bit portions is the b-bit portion containing the error (w is an integer greater than zero and less than b).

19 Claims, 7 Drawing Sheets

U.S. PATENT DOCUMENTS

| | | | |
|---|---|---|---|
| 5,490,155 | A | 2/1996 | Abdoo et al. |
| 5,502,675 | A | 3/1996 | Kohno et al. |
| 5,574,856 | A | 11/1996 | Morgan et al. |
| 5,640,353 | A | 6/1997 | Ju |
| 5,682,394 | A | 10/1997 | Blake et al. |
| 5,745,508 | A * | 4/1998 | Prohofsky .................. 714/766 |
| 5,757,823 | A | 5/1998 | Chen et al. |
| 5,758,056 | A | 5/1998 | Barr |
| 5,812,564 | A | 9/1998 | Bonke et al. |
| 5,822,257 | A | 10/1998 | Ogawa |
| 5,867,642 | A | 2/1999 | Vivio et al. |
| 5,872,790 | A | 2/1999 | Dixon |
| 5,872,798 | A * | 2/1999 | Baggen et al. .............. 714/755 |
| 5,909,541 | A | 6/1999 | Sampson et al. |
| 5,923,682 | A | 7/1999 | Seyyedy |
| 5,928,367 | A | 7/1999 | Nelson et al. |
| 5,953,265 | A | 9/1999 | Walton et al. |
| 5,978,952 | A | 11/1999 | Hayek et al. |
| 5,987,628 | A | 11/1999 | Von Bokern et al. |
| 6,009,548 | A | 12/1999 | Chen et al. |
| 6,018,817 | A | 1/2000 | Chen et al. |
| 6,038,680 | A | 3/2000 | Olarig |
| 6,044,483 | A | 3/2000 | Chen et al. |
| 6,052,818 | A | 4/2000 | Dell et al. |
| 6,065,102 | A | 5/2000 | Peters et al. |
| 6,070,255 | A | 5/2000 | Dell et al. |
| 6,076,182 | A | 6/2000 | Jeddeloh |
| 6,101,614 | A | 8/2000 | Gonzales et al. |
| 6,115,828 | A | 9/2000 | Tsutsumi et al. |
| 6,141,789 | A | 10/2000 | Cypher |
| 6,158,025 | A | 12/2000 | Brisse et al. |
| 6,167,495 | A | 12/2000 | Keeth et al. |
| 6,181,614 | B1 | 1/2001 | Aipperspach et al. |
| 6,209,113 | B1 | 3/2001 | Roohparvar |
| 6,223,301 | B1 | 4/2001 | Santeler et al. |
| 6,233,716 | B1 | 5/2001 | Cypher |
| 6,233,717 | B1 | 5/2001 | Choi |
| 6,246,616 | B1 | 6/2001 | Nagai et al. |
| 6,282,686 | B1 | 8/2001 | Cypher |
| 6,301,680 | B1 | 10/2001 | Cypher |
| 6,301,780 | B1 | 10/2001 | Templeton |
| 6,367,046 | B1 | 4/2002 | Chapman et al. |
| 6,393,597 | B1 | 5/2002 | Cypher |
| 6,453,440 | B1 | 9/2002 | Cypher |
| 6,473,880 | B1 | 10/2002 | Cypher |
| 6,477,682 | B2 | 11/2002 | Cypher |
| 6,505,305 | B1 | 1/2003 | Olarig |
| 6,973,613 | B2 | 12/2005 | Cypher |
| 6,976,194 | B2 | 12/2005 | Cypher |
| 6,996,766 | B2 | 2/2006 | Cypher |
| 7,103,824 | B2 * | 9/2006 | Halford ....................... 714/759 |
| 2001/0001158 | A1 | 5/2001 | Tetrick |
| 2002/0157044 | A1 * | 10/2002 | Byrd ........................... 714/703 |
| 2003/0093744 | A1 | 5/2003 | Leung et al. |
| 2003/0163777 | A1 | 8/2003 | Holt |
| 2003/0233611 | A1 | 12/2003 | Humlicek et al. |

OTHER PUBLICATIONS

K. A. S. Immink, "A Practical Method for Approaching the Channel Capacity of Constrained Channels," Sep. 1997, IEEE Transactions on Information Theory, vol. 43, No. 5, pp. 1389-1399.

D.C. Bossen, "b-Adjacent Error Correction," IBM J. Res. And Development, vol. 14, No. 4, 1970, pp. 402-408.

Shu Lin, "Error Control Coding, Fundamentals and Applications," Prentice-Hall 1983, pp. 503-525 and 532.

IBM Technical Disclosure Bulletin, "Memory Chip Failure-Detection Mechanism", Mar. 1991, vol. 33, No. 10A, XP000110029, pp. 240-242.

Saxena, et al., "Error Detection and Handling in a Superscalar, Speculative Out-of-Order Execution Processor System," IEEE, 1995, pp. 464-471.

Rolf Johansson, "Two Error-Detecting and Correcting Circuits for Space Applications," IEEE 1996, pp. 436-439.

IBM Technical Disclosure Bulletin, "Concurrent On-Lin Array Chip Sparing From Scrub-Assisted Fault Data," Dec. 1991, vol. 34, No. 7A, pp. 16-19.

Dell Computer Corp., David Locklear, "Chipkill Correct Memory Architecture," Aug. 3, 2003, 3 pages.

Dell, "A White Paper on the Benefits of Chipkill-Correct ECC for PC Server Main Memory," IBM Microelectronics Division, Nov. 1997, pp. 1-23.

"The IBM Eserver pSeries 690, Reliability, Availability, Serviceability (RAS)," IBM Technical White Paper, Sep. 2001, 24 pages.

"Parallel Parity," http://bbs-koi.uniinc.msk.ru/tech1/1994/er_cont/block.htm, 1994, 1 pg.

"Modulo-2 Arithmetic," http://bbs-koi-uniinc.msk.ru/tech1/1994/er_cont/modulo.htm, 1994, 1 pg.

"Introduction to Error Control," http://bbs-koi-uniinc.msk.ru/tech1/1994/er_cont/intro.htm, 1994, 1 pg.

Barker et al. "ASCII Table," http://www.eng2.uconn.edu/cse/Cour...08W/References/Ref_ASCIITable.html, Feb. 1998, 1 pg.

"Parity & Computing parity," http://bbs-koi.uniinc.msk.ru/tech1/1994/er_cont/parity.htm, 1994, 2 pgs.

"Error Correction with Hamming Codes," http://bbs-koi.uniinc.msk.ru/tech1/1994/er_cont/hamming.htm, 1994, 2 pgs.

Barker et al. "Hamming Code, Background Information," http://www.eng2.uconn.edu/cse/Courses/CSE208W/Hamming/Background.html, Feb. 1998, 3 pgs.

Barker et al., "Hamming Code, Theory," http://www.eng2.uconn.edu/cse/Courses/CSE208W/Hamming/Theory.html, Mar. 1998, 2 pgs.

"Numa: Delivering the Next Level of Commodity SMP Performance," http://199.245.235.23/newsletters/html/vpoint5.html, 1996, 4 pgs.

Barker et al. "General Definitions," http://www.eng2.uconn.edu/cse/Cour...8W/References/Ref_Definitions.html, Feb. 1998, 3 pgs.

Barker et al. "Hamming Code, Lab Procedure," http://www.eng2.uconn.edu/cse/Courses/CSE208W/Hamming/Procedure.html, Jun. 1998, 3 pgs.

Burskirk, "32-Bit-Wide Memory Tolerates Failures," NT Tech Notes, Oct. 1990, p. 818.

C. L. Chen, "Symbol Error Correcting Codes for Memory Applications," IBM Corporation, IEEE, 1996, pp. 200-207.

IEEE Transactions of Computers, vol. 41, No. 2, Feb. 1992, 5 pages.

Hamada, et al., "A Class of Error Control Codes for Byte Organized Memory Systems -SbEC-(Sb+S)ED Codes-," IEEE Transactions of Computers, vol. 46, No. 1, Jan. 1997, 5 pages.

Costello, Jr., et al., "Applications of Error-Control Coding," IEEE Transactions on Information Theory, vol. 44, No. 6, Oct. 1998, pp. 2531-2560.

Ziegler, et al., "Cosmic Ray Soft Error Rates of 16-Mb DRAM Memory Chips," IEEE Journal of Solid-State Circuits, vol. 33, No. 2, Feb. 1998, pp. 246-252.

Peterson, et al., "Error-Correcting Codes," Second Edition, The MIT Press, 1972, pp. 357-373.

* cited by examiner

Magnitude Equation: $s0 = d_0 + d_1 + \ldots + d_{n-1}$ (= 0 for the error-free case)

Locator Equation: $s1 = e^0 \times d_0 + e^1 \times d_1 + \ldots + e^{n-1} \times d_{n-1}$ (= 0 for the error-free case)

If error of magnitude $e^j$ occurs in a $k^{th}$ memory:

$s0 = e^j$ $s1 = e^k \times e^j = e^k \times s0$

Fig. 1
(Prior Art)

Magnitude Equation: $s0 = d_0 + d_1 + \ldots + d_{n-1}$ (GF($2^b$) addition)

Locator Equation: $s1 = H_0 \times d_0 + H_1 \times d_1 + \ldots + H_{n-2} \times d_{n-2}$ (Matrix Multiplication in Bit Domain, assumes magnitude check symbol in $d_{n-1}$)

If error of magnitude $e^j$ occurs in a $k^{th}$ symbol (e.g. in $k^{th}$ RAM/Slice):

$s0 = e^j$ $s1 = H_k \times e^j = H_k \times s0$

Fig. 5

$$H_0 = \begin{bmatrix} e^q & e^r & \ldots & e^y \end{bmatrix}$$

b Columns; element of GF($2^w$), w<b $$H_k = \begin{bmatrix} e^{q+k} & e^{r+k} & \ldots & e^{y+k} \end{bmatrix}$$

b Columns; element of GF($2^w$), w<b

Fig. 6

Elements of GF($2^4$)

| Element | Binary Rep. |
|---|---|
| $e^0$ | 0001 |
| $e^1$ | 0010 |
| $e^2$ | 0100 |
| $e^3$ | 1000 |
| $e^4$ | 0011 |
| $e^5$ | 0110 |
| $e^6$ | 1100 |
| $e^7$ | 1011 |
| $e^8$ | 0101 |
| $e^9$ | 1010 |
| $e^{10}$ | 0111 |
| $e^{11}$ | 1110 |
| $e^{12}$ | 1111 |
| $e^{13}$ | 1101 |
| $e^{14}$ | 1001 |
| 0 | 0000 |

Elements of GF($2^3$)

| Element | Binary Rep. |
|---|---|
| $e^0$ | 001 |
| $e^1$ | 010 |
| $e^2$ | 100 |
| $e^3$ | 011 |
| $e^4$ | 110 |
| $e^5$ | 111 |
| $e^6$ | 101 |
| 0 | 000 |

Fig. 7

$$H_0 = \begin{bmatrix} e^0 & e^1 & e^2 & e^5 \end{bmatrix} \Rightarrow \begin{bmatrix} 0 & 0 & 1 & 1 \\ 0 & 1 & 0 & 1 \\ 1 & 0 & 0 & 1 \end{bmatrix}$$

↰ element of GF($2^3$)

$$H_k = \begin{bmatrix} e^{0+k} & e^{1+k} & e^{2+k} & e^{5+k} \end{bmatrix}$$

↰ element of GF($2^3$)

Fig. 8

$$\lambda = 1 - \frac{\text{number of groups of columns in } H_0 \text{ that add to zero in GF}(2^w)}{2^b - 1}$$

Fig. 9

SCALABLE-CHIP-CORRECT ECC SCHEME

BACKGROUND OF THE INVENTION

1. Field of the Invention

This invention is related to error correction code (ECC) systems.

2. Description of the Related Art

Error codes are commonly used in electronic systems to detect and correct data errors, such as transmission errors or storage errors. For example, error codes may be used to detect and correct errors in data transmitted via any transmission medium (e.g. conductors and/or transmitting devices between chips in an electronic system, a network connect, a telephone line, a radio transmitter, other wireless transmission, etc.). Error codes may additionally be used to detect and correct errors associated with data stored in the memory of computer systems. One common use of error codes is to detect and correct errors of data transmitted on a data bus of a computer system. In such systems, error correction bits, or check bits, may be generated for the data prior to its transfer or storage. When the data is received or retrieved, the check bits may be used to detect and correct errors within the data.

Component failures are a common source of error in electrical systems. Faulty components may include faulty memory chips or faulty data paths provided between devices of a system. Faulty data paths can result from, for example, faulty pins, faulty data traces, or faulty wires. Additionally, memory modules, which may contain multiple memory chips, may fail. Circuitry which drives the data paths may also fail.

Another source of error in electrical systems may be so-called "soft" or "transient" errors. Transient memory errors may be caused by the occurrence of an event, rather than a defect in the memory circuitry itself. Transient memory errors may occur due to, for example, random alpha particles or cosmic rays striking the memory circuit. Transient communication errors may occur due to noise on the data paths, inaccurate sampling of the data due to clock drift, etc. On the other hand, "hard" or "persistent" errors may occur due to component failure.

Generally, various error detection code (EDC) and error correction code (ECC) schemes are used to detect and correct memory and/or communication errors. For example, single error correct/double error detect (SEC/DED) schemes have been popular in the past. However, both hard and soft errors in a memory chip may cause multibit errors in the output of that chip. SEC/DED schemes may often not detect such errors, reducing reliability. Accordingly, "Chip-Correct" schemes have been introduced (also referred to as Chipkill ECC memory™, a trademark of International Business Machines Corporation). Generally, Chip-Correct schemes are designed to detect multi-bit errors occurring in a single memory chip, and to correct those errors.

One Chip-Correct ECC scheme uses Reed-Solomon (RS) codes to define the check bits. An RS code treats the data to be protected as symbols having b bits, where b is an integer greater than one. For example, b may be the number of bits of the data that are stored in an individual memory chip. Generally, RS codes may be designed to detect and correct errors in one or more symbols of the protected data. FIG. 1 is a diagram illustrating the equations used for a typical RS code to correct one symbol error (e.g. one or more bit errors in one memory chip). The RS code is based on Galois Field (GF) arithmetic. Generally, a Galois Field is a finite field of numbers having the property that arithmetic operations on field elements (numbers in the field) have a result in the field (i.e. another element of the field). An element of a field will be noted herein as "$e^i$", except for 0, which will be noted as "0". Addition may be defined in a Galois Field of size $2^b$ to be bitwise exclusive OR (XOR) of the elements and multiplication of two elements $e^i$ and $e^j$ may be defined as $e^{(i+j) \bmod (2^b-1)}$.

The first equation shown in FIG. 1 (labeled the magnitude equation) calculates the syndrome s0 as the sum (in $GF(2^b)$) of a set of symbols $d_0$ through $d_{n-1}$. That is, each symbol $d_0$ to $d_{n-1}$ is an element of $GF(2^b)$. If there are no errors, the sum is zero. The second equation shown in FIG. 1 (labeled the locator equation) multiplies (in $GF(2^b)$) each symbol $d_0$ to $d_{n-1}$ by a distinct, non-zero element of $GF(2^b)$ ($e^0$ to $e^{n-1}$ in FIG. 1). The sum of the multiplications is s1, and is also equal to zero for the error free case. On the other hand, an error of magnitude $e^j$ may occur in the $k^{th}$ memory. That is, $e^j$ may identify the bits that are in error within the symbol $d_k$. If such an error occurs, the output of the $k^{th}$ memory is changed by $e^j$, or (in $GF(2^b)$), the output may be the original data+$e^j$. Thus, s0=$e^j$ if such an error occurs, detecting the error (because s0 is not zero) and providing the magnitude of the error. In the locator equation, each symbol is multiplied by a distinct, non-zero element of GF(2b). Accordingly, an error of $e^j$ magnitude in the $k^{th}$ memory results in s1=$e^k$×s0 (in $GF(2^b)$). Thus, k may be determined, locating the error. The error may then be corrected based on the magnitude of the error.

Two check symbols, each having b bits, are included along with the data in the symbols $d_0$ to $d_{n-1}$. For example, $d_{n-1}$ and $d_{n-2}$ may be the check symbols. Symbol $d_{n-1}$ may be generated when the data is written to memory to ensure that s0 equals zero (e.g. the sum, in $GF(2^b)$ of the other symbols). Symbol $d_{n-2}$ may be generated when the data is written to memory to ensure that s1 equals zero. Accordingly, the RS codes require 2b check bits (or 2 check symbols). Unfortunately, adding the memory to store the 2b check bits may be cost-prohibitive in some cases. However, returning to SEC/DED codes (which may use fewer check bits) may not provide the desired level of reliability.

Note that the multiplications in $GF(2^b)$ of $e^i$ by a symbol (e.g. the multiplications illustrated in the s1 equation) may be the equivalent, in the bit domain, of a matrix multiplication of a b×b matrix whose columns are $e^{i+b-1}, e^{i+b-2}, \ldots$ to $e^i$ and the symbol represented as a b×1 matrix. Each column of the b×b matrix is constructed with the top bit as the most significant bit of the element forming that column. Thus, the b×b matrix corresponding to multiplication by $e^0$ has the columns $e^{b-1}, e^{b-2}, \ldots$ to $e^0$ (referred to as the base matrix). Matrices for multiplying by $e^k$ are obtained by multiplying the columns in the base matrix by $e^k$.

SUMMARY OF THE INVENTION

In one embodiment, an apparatus comprises an encode circuit coupled to receive input data and configured to generate corresponding codewords and a decode circuit coupled to receive codewords and detect an error in the codewords (and, in some cases, the decode circuit may correct the error). Each codeword comprises a plurality of b-bit portions (b is an integer greater than one). Additionally, each codeword comprises a first set of b check bits used to detect a magnitude of an error in a b-bit portion of the plurality of b-bit portions. Each codeword further comprises a second set of w check bits used to locate which one of the plurality of b-bit portions is the b-bit portion containing the error (w is an integer greater than zero and less than b).

Another embodiment of the apparatus includes the encode circuit and decode circuit. Each codeword in this embodiment comprises a plurality of b-bit portions (b is an integer greater than one), and each b-bit portion comprises a symbol that is an element of $GF(2^b)$. A b-bit portion of the codeword is a first check symbol comprising a sum in $GF(2^b)$ of the remaining plurality of b-bit portions. Another b-bit portion of the codeword comprises a second check symbol that is an element of $GF(2^w)$ (w is an integer greater than zero and less than b). The second check symbol is generated to satisfy an equation in which: (i) each of the symbols in the code word (excluding the first symbol) is multiplied by a different matrix having b columns and w rows, each of the columns comprising a symbol in $GF(2^w)$; and (ii) the sum of the multiplication results equals zero.

BRIEF DESCRIPTION OF THE DRAWINGS

The following detailed description makes reference to the accompanying drawings, which are now briefly described.

FIG. 1 is a diagram illustrating error correction equations using $GF(2^b)$ elements for a Reed-Solomon encoding.

FIG. 5 is a diagram illustrating equations used for one embodiment of the code word shown in FIG. 4.

FIG. 6 is a diagram illustrating one embodiment of matrices shown in FIG. 5.

FIG. 7 is a pair of tables illustrating exemplary elements of an example $GF(2^4)$ and an example $GF(2^3)$.

FIG. 8 is a diagram illustrating an example set of matrices for a code using $GF(2^4)$ error magnitude detection and $GF(2^3)$ error location.

FIG. 9 is a diagram illustrating a measure of the ability to locate errors of a given code.

Figure 2:
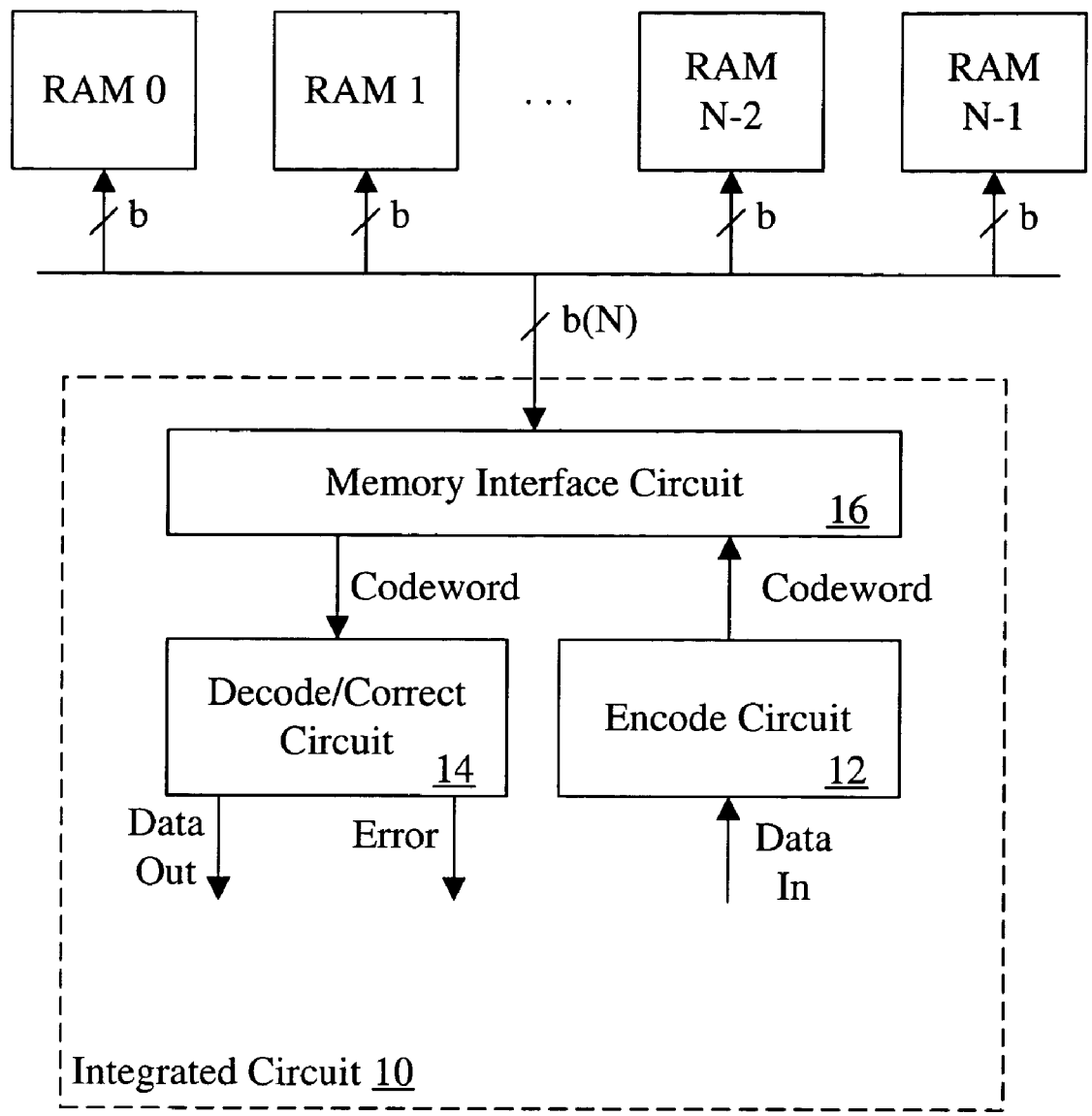
FIG. 2 is a block diagram illustrating one embodiment of an integrated circuit coupled to a set of random access memories (RAMs).

While the invention is susceptible to various modifications and alternative forms, specific embodiments thereof are shown by way of example in the drawings and will herein be described in detail. It should be understood, however, that the drawings and detailed description thereto are not intended to limit the invention to the particular form disclosed, but on the contrary, the intention is to cover all modifications, equivalents and alternatives falling within the spirit and scope of the present invention as defined by the appended claims.

DETAILED DESCRIPTION OF EMBODIMENTS

A chip-correct ECC is described which may implement fewer check bits than the RS codes, which may detect symbol (e.g. chip or transmission slice) errors, and may locate a relatively high percentage of the errors (which may permit correction of the locatable errors). In some embodiments, the chip-correct ECC scheme may be used to permit tradeoffs between the "strength" (e.g. the number of possible errors that are locatable) of the code and the number of check bits that are implemented. Thus, cost versus benefit tradeoffs may be made, while still maintaining a robust ECC scheme, in some embodiments. Particularly, any symbol error is detected with the chip-correct ECC scheme, and thus data corruption is preventable in view of any chip or slice failures.

Turning now to FIG. 2, a block diagram of one embodiment of an integrated circuit 10 is shown coupled to a plurality of memories (e.g. RAMs 0 to N−1 in FIG. 2). Each of the RAMs may have an input/output width of b (that is, b-bits are currently input to a given RAM or output from a given RAM). Generally, b may be any integer value greater than 1. For example, b may be 4, 8, 16, 32 or even higher, in various embodiments. The data interface between the integrated circuit 10 may be thus be b times N (where N is an integer equal to the number of RAMs 0 to N−1). Accordingly b(N) data bits may be transferred to or from the RAMs 0 to N−1 concurrently. In the illustrated embodiment, the integrated circuit 10 may include an encode circuit 12, a decode/correct circuit 14, and a memory interface circuit 16. The encode circuit 12 is coupled to receive input data (Data In) to be written to the plurality of memories, and is coupled to provide a codeword to the memory interface circuit 16. The decode/correct circuit 14 is coupled to receive a codeword from the memory interface circuit 16 (read from the plurality of memories) and to provide data out from the codeword (possibly correcting a detected error in the codeword). The decode/correct circuit 14 may also generate an error signal if an error is detected. The error signal may further indicate whether or not the detected error is correctable (e.g. whether or not the detected error was locatable). The memory interface circuit 16 is further coupled to communicate with the RAMs 0 to N−1, including the data interface to the RAMs. Additional interfaces to the RAMs 0 to N−1 may be provided (not shown in FIG. 2) (e.g. an address interface and a control interface).

Generally, the encode circuit 12 is configured to receive the input data and to generate corresponding codewords including the input data and the check bits (or check symbols, in some embodiments) used to detect errors in the data. As used herein, a codeword comprises one or more data bits and one or more check bits generated from the data bits according to the ECC code implemented by the encode circuit 12. A check bit may comprise a bit which is generated as a function of two or more of a set of data bits, to permit error checking (and possibly error correction, in some implementations) of the data bits. A check symbol may comprise a set of data bits which are treated, for ECC code purposes, as a symbol. More particularly, the encode circuit 12 may implement the chip-correct ECC code that implements fewer check bits than an RS code, as described above and in more detail below. In the illustrated embodiment, the code word may comprise b(N) bits, although multiple codewords may be included in the b(N) bits in other embodiments.

The decode/correct circuit 14 is coupled to receive a codeword from the memory interface circuit 16, and decodes the codeword (according to the chip-correct ECC code also implemented by the encode circuit 12) to determine if there are any errors. If no errors are detected, the data from the codeword is transmitted as the output data from the decode/correct circuit 14. If an error is detected, and can be located, the decode/correct circuit 14 may correct the error and transmit the data (with the error corrected) as the output data. The decode/correct circuit 14 may also signal that the error is detected (e.g. if the integrated circuit 10 or some other circuitry, not shown, logs information about errors that have been detected). If an error is detected, and cannot be located, the decode/correct circuit 14 may forward the erroneous data (or no data at all), and may signal that an uncorrectable error has been detected. Receiving circuitry may use the signal to determine that the forwarded data has an error.

The memory interface circuit 16 may generally be responsible for communicating between the encode circuit 12, the decode/correct circuit 14, and the RAMs 0 to N−1. That is, the memory interface circuit 16 may implement the protocols, timings, etc. required by the RAMs 0 to N−1. The memory interface circuit 16 may write codewords provided by the encode circuit 12 to memory, and may read codewords from memory to be provided to the decode/correct circuit 14.

The integrated circuit 10 may include other circuitry (not shown) that provides input data to the encode circuit 12 and receives the output data from the decode/correct circuit 14. In various embodiments, the integrated circuit 10 may include a memory controller (along with any other desired circuitry) for a computer system, an input/output (I/O) circuit (such as an Infiniband bridge) which may use the RAMs 0 to N−1 to store various data that is subject to change during use (e.g. control and/or status data such as queue factors), a processor that interface to a set of RAMs such as for an external cache, etc. In other embodiments, circuitry providing data to the encode circuit 12 and/or receiving data from the decode/correct circuit 14 may be in other integrated circuits.

It is noted that the RAMs 0 to N−1 may, in various embodiments, be implemented on one or more memory module circuits (e.g. dynamic RAM single inline memory modules (SIMMs) or dual inline memory modules (DIMMs), as desired). While RAM is used as an example, any type of memory may be used. Furthermore, it is noted that, while FIG. 2 illustrates the decode/correct circuit as a single block, separate decode and correct circuits may be implemented, as desired.

Figure 3:
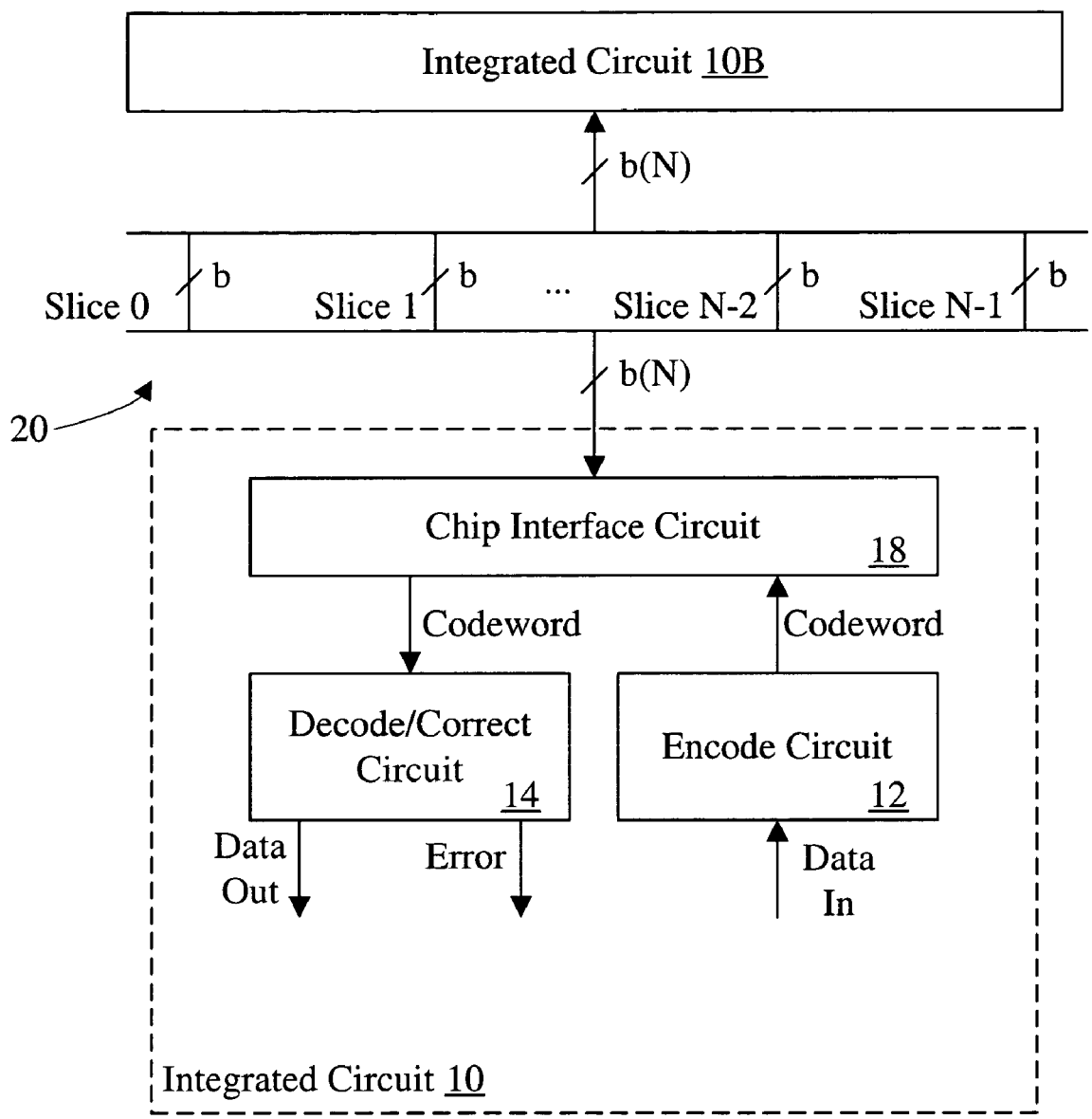
FIG. 3 is a block diagram illustrating one embodiment of an integrated circuit coupled to another integrated circuit via a communication medium.

FIG. 3 is a block diagram of a second embodiment of the integrated circuit 10. In the embodiment of FIG. 3, the integrated circuit 10 is coupled to another integrated circuit 10B via a transmission medium 20. The transmission medium 20 is divided in a set of b-bit slices (slice 0 to slice N−1 in FIG. 3). The integrated circuit 10 includes the decode/correct circuit 14 and the encode circuit 12 similar to the embodiment of FIG. 2 (and operating in a similar manner to the discussion of FIG. 2). In the embodiment of FIG. 3, the integrated circuit 10 also includes a chip interface circuit 18 that is coupled to transmit and receive codewords on the transmission medium 20. Codewords provided by the encode circuit 12 are transmitted to the integrated circuit 10B by the chip interface circuit 18, and received codewords from the integrated circuit 10B are provided to the decode/correct circuit 14.

The slices of the transmission medium 20 may be treated as symbols for the chip-correct ECC scheme implemented by the encode circuit 12 and the decode circuit 14. Thus, the "chip" error that is being detected (and possibly corrected) in this case is an error on one of the slices 0 to N−1. Generally, the transmission medium 20 may be any form of medium over which data may be transmitted. For example, the transmission medium 20 may include conductors on which signals representing the data bits may be transmitted. The transmission medium 20 may also include circuitry (e.g. repeaters which amplify the signal during transmission, routers or switches in a networked system, etc.). In other embodiments, the transmission medium 20 may be a wireless transmission medium. Generally, a "slice" refers to a portion of the transmission medium on which two or more bits of a codeword are transmitted. The transmission may be serial (e.g. b-bits over a single transmission medium), parallel (e.g. media transmitting b-bits in parallel, as illustrated in FIG. 3), or a combination (e.g. media transmitting b/i-bits in parallel, serially transmitting the b-bits in i transmissions).

It is noted that, in some embodiments, the encode circuit 12 may be implemented as trees of XOR circuits receiving the input data. For example, the magnitude check symbol may be implemented as a bitwise XOR of the other symbols. The locator check symbol may be a function of the matrices $H_k$ as described below. Similarly, the decode/correct circuit 14 may similarly include trees of XOR circuits. Alternatively, any other combinatorial logic circuitry may be used, including any Boolean equivalents of the trees of XOR circuits.

Figure 4:
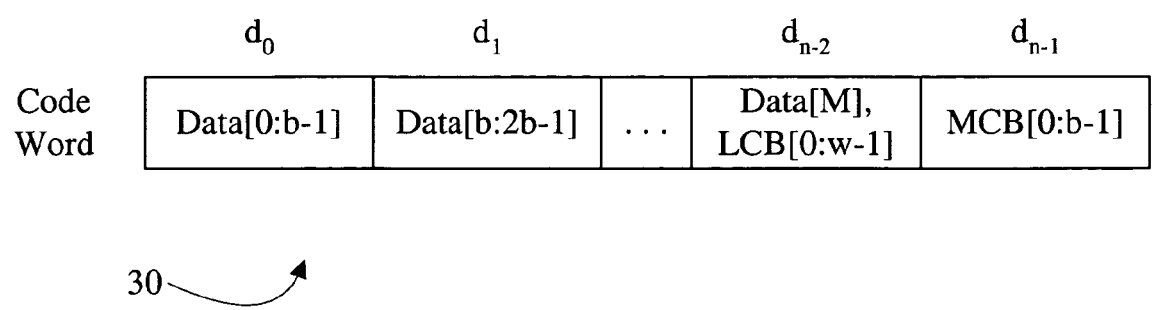
FIG. 4 is a block diagram illustrating one embodiment of a code word.

Turning now to FIG. 4, a block diagram illustrating one embodiment of a codeword 30 for the chip-correct ECC scheme is shown. The codeword 30 comprises N b-bit portions (e.g. symbols $d_0$ to $d_{n-1}$ comprising elements of $GF(2^b)$). In the embodiment of FIG. 2, each symbol $d_0$ to $d_{n-1}$ may be stored in a different RAM 0 to N−1 (although in other embodiments multiple codewords may be concurrently provided to the set of RAMs 0 to N−1). In the embodiment of FIG. 3, each symbol $d_0$ to $d_{n-1}$ may be transmitted on a different slice 0 to N−1.

Some of the symbols comprise data bits of the data being protected by the codeword 30. For example, in the embodiment of FIG. 4, symbol $d_0$ includes data bits 0 to b−1 and symbol $d_1$ includes data bits b to 2b−1. Other data bits may be included in other symbols (not shown in FIG. 4). One symbol is the magnitude check symbol formed from the magnitude check bits (MCB in FIG. 4). For example, symbol $d_{n-1}$ is used in this case, although the magnitude check symbol may be any of the symbols $d_0$ to $d_{-1}$ in various embodiments. Another symbol includes the locator check bits (LCB), which are fewer than b-bits in this embodiment. Particularly, there may be w locator check bits (0 to w−1), where w is an integer greater than zero and less than b. The symbol that includes the locator check bits may also include one or more data bits to complete the symbol. For example, symbol $d_{n-2}$ may include the locator check bits and one or more data bits (e.g. data bit M in FIG. 4), although any of the symbols $d_0$ to $d_{n-1}$ may be used in other embodiments. The locator check bits may also be viewed as an element of $GF(2^w)$, and may be referred to as the locator check symbol. In other embodiments, the locator check bits may be distributed over two or more symbols. Each locator check bit may be located in a different bit position within the symbols. For example, in the matrices $H_k$ described below, check bits may be positioned in columns that have a single one in them, in some implementations.

As shown in symbol $d_{n-2}$ in FIG. 4, one or more data bits may form the symbol with the locator check symbol. Thus, if the symbols are each stored in a different RAM (e.g. the embodiment of FIG. 2), the locator check symbol may be stored in unused bits in the RAM that stores the one or more data bits. In other words, N−2 RAMs were needed to store the data bits, with some bits in the RAM N−2 left unused. Thus, the locator check symbol may be stored for "free" (by not increasing the cost of the memory to include another memory device (RAM) to store the locator check symbol). Similarly, the locator check symbol may be transmitted for "free" (by not increasing the number of transmission slices to transmit the locator check symbol).

The magnitude check symbol is used to detect whether or not there is an error in the codeword 30, as well as to indicate the magnitude of the error. The locator check symbol is used to locate the error in one of the symbols of the codeword 30. As used herein, the "magnitude" of the error may be an indication of which bits in the symbol are in error. For example, each bit of the magnitude that is set may indicate that the corresponding bit in the symbol is in error.

FIG. 5 is a diagram illustrating the equations that may define the chip-correct ECC scheme for one embodiment. Encoding the codeword 30 by the encode circuit 14 may comprise generating the magnitude check symbol (or magnitude check bits) and the locator check symbol (or locator check bits) such that s0 and s1 are zero, and decoding the codeword 30 may comprise evaluating s0 to detect an error, and evaluating s1 to potentially locate the error.

The value s0 is the sum (in $GF(2^b)$) of the symbols in the codeword 30. The encode circuit 12 may calculate the magnitude check symbol (or magnitude check bits distributed over two or more symbols), when generating a code word, to cause s0 to be zero. For example, the magnitude check symbol may be defined as the sum (in $GF(2^b)$) of the other symbols in the codeword 30.

In terms of RS codes (e.g. see FIG. 1), any set of linearly independent columns of $GF(2^b)$ elements may be used to form the base matrix (as described above with regard to FIG. 1) without affecting the properties of the code. That is, the base matrix may be different from the b×b matrix whose columns are $e^{b-1}, e^{b-2}, \ldots$ to $e^0$. Matrices may be formed for each other $e^k$ used in the s1 equation by multiplying the columns of the base matrix corresponding to by $e^k$. Such a set of matrices may also produce a linear transformation of the data in the symbols. Such RS codes are contemplated. Additionally, a chip-correct ECC scheme using fewer locator check bits than the number of bits in a symbol is contemplated. In such a scheme, the value s1 may be calculated as a matrix multiplication in the bit domain of the symbols $d_0$ to $d_{n-2}$ (assuming the magnitude check symbol is $d_{n-1}$) by various matrices $H_0$ to $H_{n-2}$. Generally, the value s1 may exclude the magnitude check symbol. Each matrix $H_0$ to $H_{n-2}$ may have b columns and w rows, and each column of the matrix may be an element of $GF(2^w)$. FIG. 6, for example, shows $H_0$ comprising $GF(2^w)$ elements $e^q, e^r, \ldots$ to $e^v$. Generally, any set of b elements from $GF(2^w)$ may be selected. The various matrices may be related to each other. For example, a matrix $H_k$ is shown in FIG. 6 having elements $e^{q+k}, e^{r+k}, \ldots$ to $e^{v+k}$. That is, the $H_0$ matrix may include a base set of $GF(2^w)$ elements, and the other matrices $H_k$ may be formed by multiplying the base set by $e^k$ (in $GF(2^w)$). The encode circuit 12 may calculate the locator check symbol for a codeword such that s1 is zero. The decode/correct circuit 14 may effectively evaluate the s0 and s1 equations to detect an error and correct the error, if locatable. The actually operation of the circuit may not be to evaluate the equations shown in FIG. 5 directly, but rather may be XOR trees, for example, in some embodiments.

Since each symbol is multiplied by a distinct non-zero matrix $H_k$ (derived from $H_0$ by multiplying the columns of $H_0$ by $e^k$), an error of a given magnitude in one symbol may be located. That is, as shown in FIG. 5, an error of magnitude $e^j$ in the $k^{th}$ symbol results in an error magnitude of $e^j$ (that is, the decode/correct circuit 14 may calculate s0 equal to $e^j$). Additionally, s1 evaluates to $H_k \times s0$. ($H_k \times s0$) is equal to a multiplication in $GF(2^w)$ of ($H_0 \times s0$) by $e^k$. The value s1 is distinct for each value of k provided ($H_0 \times s0$) is non-zero. Thus k may be identified. However, at least one error may not be locatable. A set of b elements from $GF(2^w)$, where w is less than b, may exhibit at least some linear dependence. That is, a sum of two or more of the b elements will be zero. Each sum of two or more of the b elements that is zero corresponds to one error magnitude that may not be located (because s1 still evaluates to zero). Viewed in another way, if an error magnitude has set (one) bits in locations that correspond to columns in the matrix that add to zero, s1 will evaluate to zero and the error will not be located. The error will be mapped to zero independent of which symbol is in error, since each of the matrices $H_k$ is derived from $H_0$ by multiplying the columns by $e^k$. A sum of columns that equal zero multiplied by $e^k$ is still zero. Accordingly, it may be desirable, in some embodiments, to select the elements for the $H_0$ matrix to have the fewest number of sets of columns that add to zero.

It is noted that s1 does not cover the magnitude check symbol. An error in the magnitude check symbol yields s0=error magnitude and s1=0. A combination of a non-zero s0 and a zero s1 indicates an error in the magnitude check symbol unless the error magnitude has set (one) bits in locations that correspond to columns in the matrix that add to zero (in which case the error is not locatable).

As mentioned above, each symbol (except the magnitude check symbol) may be multiplied by a distinct non-zero matrix $H_0$ to $H_{n-2}$ formed by multiplying $H_0$ by distinct non-zero elements of $GF(2^w)$. Accordingly, the number of distinct non-zero elements of $GF(2^w)$ may be at least (number of symbols −1) and thus the number of bits w in the locator check symbol (the number of locator check bits) may have a lower bound of the ceiling function of $\log_2$[number of symbols]. As used herein, a ceiling function of x may have, as a result, the smallest integer which is greater than or equal to x. In other words, w may have a lower bound of the ceiling function of $\log_2$[number of RAMs] or the ceiling function of $\log_2$[number of slices] for the embodiments of FIGS. 2 and 3, respectively, using the codeword 30 shown in FIG. 4. In some embodiments, the $GF(2^w)$ elements selected for the matrix $H_0$ need not be unique (that is, the same element may be selected twice). Thus, w may not have any bounds that are a function of b.

With the chip-correct ECC scheme illustrated herein, there are four possible outcomes of s0 and s1: (i) s0 and s1 both zero; (ii) s0 non-zero, s1 non-zero; (iii) s0 non-zero, s1 zero; and (iv) s0 zero, s1 non-zero. Case (i) corresponds to no error. Case (ii) corresponds to a detectable and locatable (correctable) error. Case (iii) corresponds to a detectable but non-locatable (non-correctable) error if the error magnitude has set (one) bits in locations that correspond to columns of the matrix that add to zero. Other error magnitudes correspond to a correctable error in the magnitude check symbol. Case (iv) corresponds to a non-correctable error due to an error in more than one symbol (e.g. more than one RAM output or slice).

It is noted that the chip-correct ECC scheme illustrated herein may be combined with other ECC schemes (e.g. using additional check bits) to correct additional errors, as desired. For example, a SEC/DED scheme across the codeword could be implemented in addition.

FIGS. 7 and 8 illustrate an example for b=4 and w=3. FIG. 7 illustrates the exemplary $GF(2^4)$ and $GF(2^3)$, including the elements and their binary representation. Other constructions of $GF(2^4)$ and $GF(2^3)$ are possible and may be used. Given the example in FIG. 7, one possible matrix $H_0$ may be shown in FIG. 8. In the example of FIG. 8, the only set of columns that adds to zero in $GF(2^3)$ is the sum of all the columns (i.e. the sum of $e^0, e^1, e^2$ and $e^5$). Each sum of any two or three of the columns are non-zero. Additionally shown for the matrix $H_0$, to the right of the arrow in FIG. 8, is the matrix $H_0$ in binary form using the $GF(2^3)$ elements shown in FIG. 7. Each other matrix $H_k$ may then be as shown in FIG. 8 (multiplying each column by $e^k$, an element of $GF(2^3)$). Thus, an error of magnitude 1111 (in binary) still results in s1 evaluating to zero, but any other symbol error results in a unique non-zero s1 and thus the symbol in error may be located.

A figure of merit may be calculated for a given embodiment of the chip-correct ECC code, which measures the number of possible errors which are uncorrectable as a function of the total number of possible errors. The figure of merit (Greek letter lambda) is illustrated in FIG. 9 and may be calculated as 1 minus the number of groups of columns in $H_0$ that add to zero in $GF(2^w)$ divided by the total number of possible errors ($2^{b}-1$). In some embodiments, lambda may be quite high (e.g. 95% or higher) even if w is quite a bit less than b. For example, if b is 8 and w is 4, approximately 95% of the errors in 60 bits of data may be located.

Numerous variations and modifications will become apparent to those skilled in the art once the above disclosure is fully appreciated. It is intended that the following claims be interpreted to embrace all such variations and modifications.

What is claimed is:

1. An apparatus comprising:
an encoder coupled to receive input data and configured to generate corresponding codewords; and
a decoder coupled to receive codewords and detect an error in the codewords;
wherein each codeword comprises a plurality of b-bit portions including two or more b-bit portions that contain data, and further including a first set of b check bits and a second set of w check bits;
wherein b is an integer greater than one, and wherein the first set of b check bits is used to detect a magnitude of an error in a first b-bit portion of the plurality of b-bit portions, wherein the magnitude of the error indicates whether or not an error is detected and further indicates which bits within the first b-bit portion are in error, and wherein the second set of w check bits is used to locate which one of the plurality of b-bit portions is the first b-bit portion containing the error, wherein w is an integer greater than zero and less than b;
wherein the encoder is configured to generate the first set of b check bits responsive to the plurality of b-bit portions of the codeword excluding the b-bit portion that stores the first set of b check bits, and wherein the encoder is configured to generate the second set of w check bits for a given codeword responsive to the data in the codeword; and
wherein the decoder is configured to decode the first set of b check bits and the codeword to detect and error and the magnitude of the error, and wherein the decoder is configured to decode the second set of w check bits and the data in the code word to locate the first b-bit portion containing the error.

2. The apparatus as recited in claim 1 wherein w is at least a ceiling function of $\log_2$ [a number of the plurality of b-bit portions].

3. The apparatus as recited in claim 1 wherein the codewords are stored in and retrieved from a plurality of memories, wherein each memory stores a different one of the plurality of b-bit portions of a given code word.

4. The apparatus as recited in claim 3 wherein each memory has a b-bit input/output width.

5. The apparatus as recited in claim 1 wherein the codewords are transmitted on a transmission medium comprising a plurality of slices.

6. The apparatus as recited in claim 5 wherein each of the plurality of slices comprises b conductors that carry the b-bit portions during use.

7. The apparatus as recited in claim 1 wherein a second b-bit portion of the plurality of b-bit portions comprises the first set of check bits, and wherein the encoder is configured to generate the first set of check bits as a sum, in $GF(2^b)$, of the other ones of the plurality of b-bit portions excluding the second b-bit portion.

8. The apparatus as recited in claim 7 wherein the encoder is configured to generate the second set of check bits according to an equation in which each of the plurality of b-bit portions except the second b-bit portion is multiplied by a different matrix having b columns and w rows, each column of the matrix being an element of $GF(2^w)$, wherein the results of the multiplications are summed to equal zero.

9. The apparatus as recited in claim 1 wherein a second b-bit portion of the plurality of b-bit portions comprises the second set of check bits, and wherein the second b-bit portion of the codeword further comprises at least one data bit.

10. The apparatus as recited in claim 1 wherein the decoder is further configured to correct the error if the error is located by the second set of check bits, wherein at least one possible error is not locatable using the second set of check bits.

11. An apparatus comprising:
an encoder coupled to receive input data and configured to generate corresponding codewords; and
a decoder coupled to receive codewords and detect an error in the codewords;
wherein each codeword comprises a plurality of b-bit portions including two or more b-bit portions that contain data, and further including a first check symbol and a second check symbol;
wherein b is an integer greater than one, each b-bit portion comprising a symbol that is an element of $GF(2^b)$, and wherein a first b-bit portion of the plurality of b-bit portions is a first check symbol, and wherein the encoder is configured to generate the first check symbol as a sum in $GF(2^b)$, of the remaining plurality of b-bit portions, and wherein a second b-bit portion of the plurality of b-bit portions comprises the second check symbol that is an element of $GF(2^w)$, wherein w is an integer greater than zero and less than b, and wherein the encoder is configured to generate the second check symbol to satisfy an equation in which each of the symbols in the code word, excluding the first check symbol, is multiplied by a different matrix having b columns and w rows, each of the columns comprising a symbol in $GF(2^w)$, and the sum of the multiplication results equaling zero, and wherein the first check symbol is used to detect a magnitude of an error in a first b-bit portion of the plurality of b-bit portions of the codeword, wherein the magnitude of the error indicates whether or not an error is detected and further indicates which bits within the first b-bit portion are in error, and wherein the second check symbol is used to locate which of the plurality of b-bit portions is the first b-bit portion that contains the error.

12. The apparatus as recited in claim 11 wherein the decoder is further configured to correct the error in the symbol if the error is locatable, wherein at least one possible error is not locatable.

13. The apparatus as recited in claim 11 wherein w is at least a ceiling function of $\log_2$ [a number of the plurality of b-bit portions].

14. The apparatus as recited in claim 11 wherein the codewords are stored in and retrieved from a plurality of memories, wherein each memory stores a different one of the plurality of b-bit portions of a given code word.

15. The apparatus as recited in claim 11 wherein the codewords are transmitted on a transmission medium comprising a plurality of b-bit slices.

16. A method comprising:
receiving input data in an integrated circuit, the integrated circuit comprising an encoder; and
the encoder generating a corresponding codeword for the input data, wherein the codeword comprises a plurality of b-bit portions including two or more b-bit portions that contain input data, and further including a first set of b check bits and a second set of w check bits; and
wherein b is an integer greater than one, and wherein the first set of b check bits used to detect a magnitude of an error in a first b-bit portion of the plurality of b-bit portions, wherein the magnitude of the error indicates whether or not an error is detected and further indicates which bits within the first b-bit portion are in error, and wherein the second set of w check bits is used to locate which one of the plurality of b-bit portions is the first b-bit portion containing the error, wherein w is an integer greater than zero and less than b, and wherein generating the corresponding code word for the input data comprises:

the encoder generating the first set of b check bits responsive to the plurality of b-bit portions of the codeword excluding the b-bit portion that stores the first set of b check bits; and the encoder generating the second set of w check bits for a given codeword responsive to the input data in the codeword.

17. The method as recited in claim 16 wherein w is at least a ceiling function of $\log_2$ [a number of the plurality of b-bit portions].

18. The method as recited in claim 16 wherein a second b-bit portion of the plurality of b-bit portions comprises the first set of check bits, and wherein generating the first set of check bits is performed as a sum, in $GF(2^b)$, of the other ones of the plurality of b-bit portions excluding the second b-bit portion.

19. The method as recited in claim 18 wherein generating the second set of check bits is performed according to an equation in which each of the plurality of b-bit portions except the second b-bit portion is multiplied by a different matrix having b columns and w rows, each column of the matrix being an element of $GF(2^w)$, wherein the results of the multiplications are summed to equal zero.

* * * * *